(12) United States Patent
Moriya et al.

(10) Patent No.: US 8,071,477 B2
(45) Date of Patent: Dec. 6, 2011

(54) METHOD OF MANUFACTURING SEMICONDUCTOR DEVICE AND SUBSTRATE PROCESSING APPARATUS

(75) Inventors: Atsushi Moriya, Toyama (JP); Tetsuya Marubayashi, Toyama (JP); Yasuhiro Inokuchi, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 46 days.

(21) Appl. No.: 12/637,229

(22) Filed: Dec. 14, 2009

(65) Prior Publication Data
US 2010/0151682 A1    Jun. 17, 2010

(30) Foreign Application Priority Data
Dec. 15, 2008  (JP) .................. 2008-317889

(51) Int. Cl.
*H01L 21/44* (2006.01)
*C23C 16/00* (2006.01)

(52) U.S. Cl. ......... 438/680; 118/715; 118/720; 118/733

(58) Field of Classification Search .......... 438/510–569, 438/584–688; 118/715–733
See application file for complete search history.

(56) References Cited

U.S. PATENT DOCUMENTS

| | | | | |
|---|---|---|---|---|
| 3,279,946 A | * | 10/1966 | Schaarschmidt | 438/478 |
| 6,410,383 B1 | * | 6/2002 | Ma | 438/247 |
| 2005/0079691 A1 | * | 4/2005 | Kim et al. | 438/481 |
| 2007/0034158 A1 | * | 2/2007 | Nakaiso | 118/725 |

* cited by examiner

*Primary Examiner* — Michael Lebentritt
*Assistant Examiner* — Karen Kusumakar
(74) *Attorney, Agent, or Firm* — Brundidge & Stanger, P.C.

(57) ABSTRACT

Formation of a boron compound is suppressed on the inner wall of a nozzle disposed in a high-temperature region of a process chamber. A semiconductor device manufacturing method comprises forming a boron doped silicon film by simultaneously supplying at least a boron-containing gas as a constituent element and a chlorine-containing gas a constituent element to a gas supply nozzle installed in a process chamber in a manner that concentration of chlorine (Cl) is higher than concentration of boron in the gas supply nozzle.

5 Claims, 2 Drawing Sheets

US 8,071,477 B2

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2008-317889, filed on Dec. 15, 2008, in the Japanese Patent Office, the entire contents of which are hereby incorporated by reference.

BACKGROUND OF THE INVENTION

1. Field of the Invention

The present invention relates to a method of manufacturing a semiconductor device and a substrate processing apparatus, and more particularly, to a method of manufacturing a semiconductor device and a substrate processing apparatus, which are designed such that formation of boron (B)-compound on a nozzle of the apparatus can be prevented when substrates are processed.

2. Description of the Prior Art

To dope a wafer (silicon substrate) with boron (B) in a general decompression chemical vapor deposition (CVD) apparatus, $B_2H_6$ (diborane) gas can be used. For example, when a boron-doped silicon film is formed, $B_2H_6$ and a silicon (Si)-compound (silicon-containing gas as a constituent element such as $SiH_4$, $Si_2H_6$, and $SiH_2Cl_2$) are supplied, and when a Boron-doped silicon germanium film is formed, a germanium (Ge)-compound (Ge-containing gas as a constituent element) is supplied together with $B_2H_6$ and a Si-compound, so as to form a B-doped film on the surface of a wafer. Although $BCl_3$ can be used as a boron doping gas instead of $B_2H_6$, the use of $B_2H_6$ is preferable in that $B_2H_6$ does not cause metal contamination because $B_2H_6$ does not include chlorine (Cl), and moreover, $B_2H_6$ is inexpensive.

In the case where a plurality of wafers are processed by using a vertical or horizontal apparatus, most of $B_2H_6$ is consumed by wafers disposed at the upstream side of a process chamber because $B_2H_6$ is very reactive, and thus wafers disposed at the downstream side of the process chamber are not properly doped. For this reason, a plurality of nozzles are installed in a manner that the nozzles are disposed at the downstream side as well as the upstream side, so as to improve the uniformity of inter-wafer boron concentration.

However, in the case where nozzles are disposed as described above, if nozzles disposed at a high-temperature region of a process chamber is heated to about 300° C. or higher, $B_2H_6$ decomposes thermally in the nozzles to cause deposition of B-compound films on the inner walls of the nozzles. That is, $B_2H_6$ is consumed in the nozzles and may not be introduced into the process chamber. Along with this problem, there also arise other problems, such as difficulties in controlling and maintaining the uniformity of inter-wafer boron concentration, and generation of particles caused by B-compound films stripped from the inner walls of the nozzles.

SUMMARY OF THE INVENTION

An object of the present invention is to suppress formation of a boron-compound film on an inner wall of a nozzle.

According to an aspect of the present invention, there is a method of manufacturing a semiconductor device, the method comprising: loading a plurality of substrates into a process chamber wherein the plurality of substrates are stacked and held at a predetermined interval; simultaneously supplying at least a boron-containing gas as a constituent element and a chlorine-containing gas as a constituent element to a gas supply nozzle installed in the process chamber in a manner that a concentration of chlorine in the gas supply nozzle is higher than that of boron in the gas supply nozzle to generate a compound containing the boron and the chlorine in the gas supply nozzle; forming boron-doped silicon films on the plurality of substrates by doping each of the plurality of substrates with the boron contained in the compound; and unloading the plurality of substrates from the process chamber.

According to another aspect of the present invention, there is provided a substrate processing apparatus comprising: a process chamber configured to accommodate a plurality of substrates; a heater configured to heat the plurality of substrates; a gas supply unit comprising a gas supply nozzle configured to supply at least a silicon-containing gas as a constituent element, a boron-containing gas as a constituent element and a chlorine-containing gas as a constituent element into the process chamber; and a control unit configured to control the process chamber, the heater and the gas supply unit, wherein the control unit controls the gas supply unit to simultaneously supply at least the boron-containing gas and the chlorine-containing gas to the gas supply nozzle installed in the process chamber in a manner that a concentration of chlorine in the gas supply nozzle is higher than that of boron in the gas supply nozzle to generate a compound containing the boron and the chlorine in the gas supply nozzle whereby a boron-doped silicon film is formed on each of the plurality of substrates loaded in the process chamber by doping each of the plurality of substrates with the boron contained in the compound.

DETAILED DESCRIPTION OF THE PREFERRED EMBODIMENTS

Preferable embodiments of the present invention will be described hereinafter with reference to the attached drawings.

In the embodiments, a substrate processing apparatus is configured as an example of semiconductor manufacturing apparatuses used to manufacture semiconductor device integrated circuits (ICs). In the following description, as an example of substrate processing apparatuses, a vertical apparatus configured to perform a process such as a heat treatment process on a substrate will be described.

Figure 1:
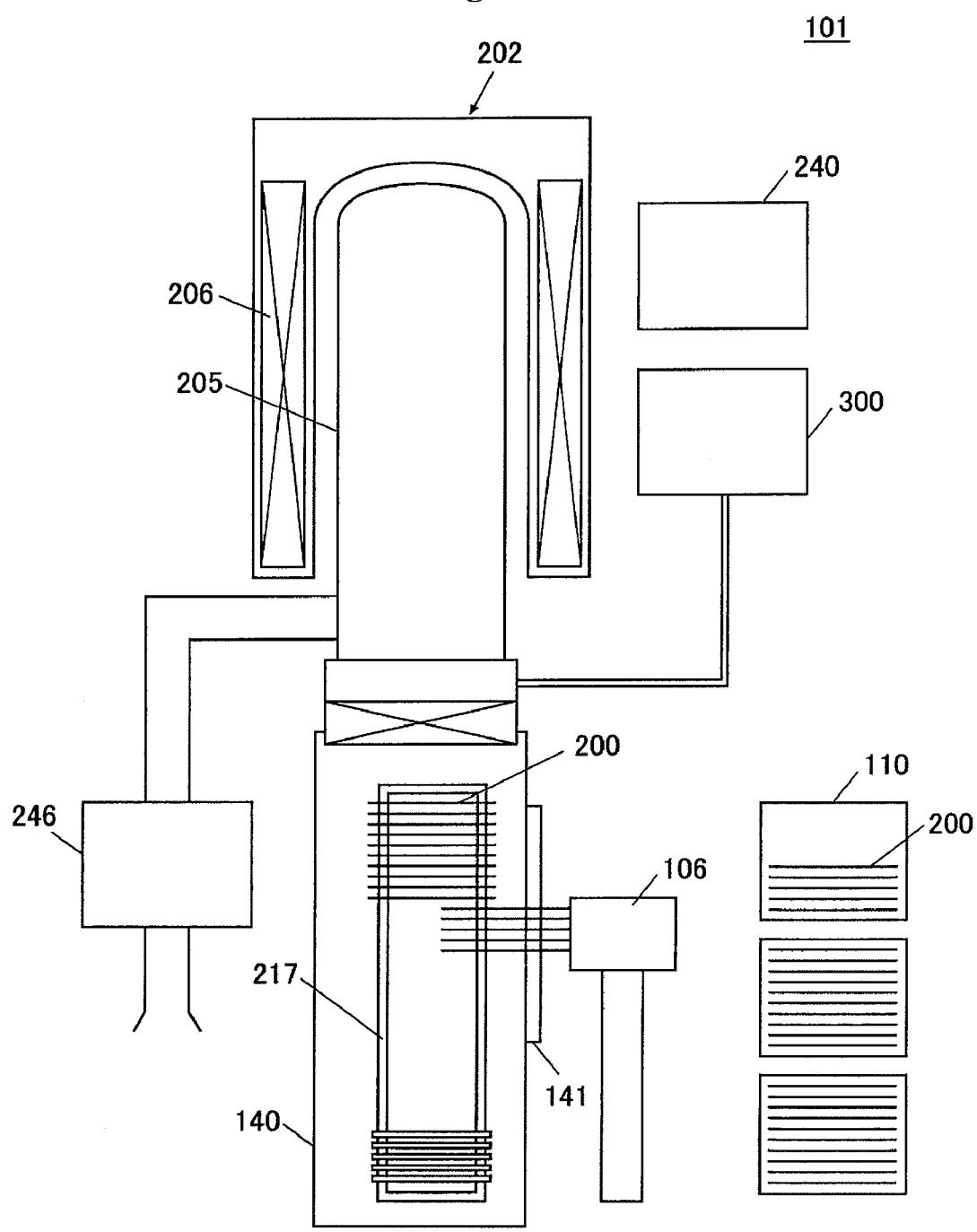
FIG. 1 is a schematic view illustrating a substrate processing apparatus.

FIG. 1 is a schematic view illustrating a substrate processing apparatus 101 according to an embodiment of the present invention.

As shown in FIG. 1, the substrate processing apparatus 101 includes a gas supply device 300, a transfer machine 106, cassettes 110, a process furnace 202, a boat 217, a controller 240, a vacuum exhaust device 246, and a load lock chamber 140.

In the substrate processing apparatus 101, a plurality of cassettes 110 are accommodated, and each of the cassettes 110 holds a plurality of wafers 200 in a state where the wafers 200 are horizontally positioned. Wafers 200 are made of a material such as silicon and have a disk shape.

The transfer machine 106 is used to transfer wafers 200 from the cassettes 110 to the boat 217 or from the boat 217 to the cassettes 110, and for this, the transfer machine 106 is capable of picking up wafers 200. That is, the transfer machine 106 is configured to charge wafers 200 into the boat 217 (wafer charging) and discharge wafers 200 from the boat 217 (wafer discharging). Before a substrate processing process is started, the boat 217 is accommodated in the load lock chamber 140 located just under the process furnace 202. An opening part 141 is provided at the sidewall of the load lock chamber 140, and the transfer machine 106 performs a wafer charging operation through the opening part 141.

The process furnace 202 includes a heater 206 and a reaction tube 205. The heater 206 is installed around the reaction tube 205 so as to heat the reaction tube 205. The gas supply device 300 is connected to the process furnace 202 so as to supply various process gases, and the vacuum exhaust device 246 is connected to the process furnace 202 so as to evacuate the inside of the process furnace 202. The process furnace 202 will be described later in more detail.

The controller 240 controls various operations of the substrate processing apparatus 101.

Figure 2:
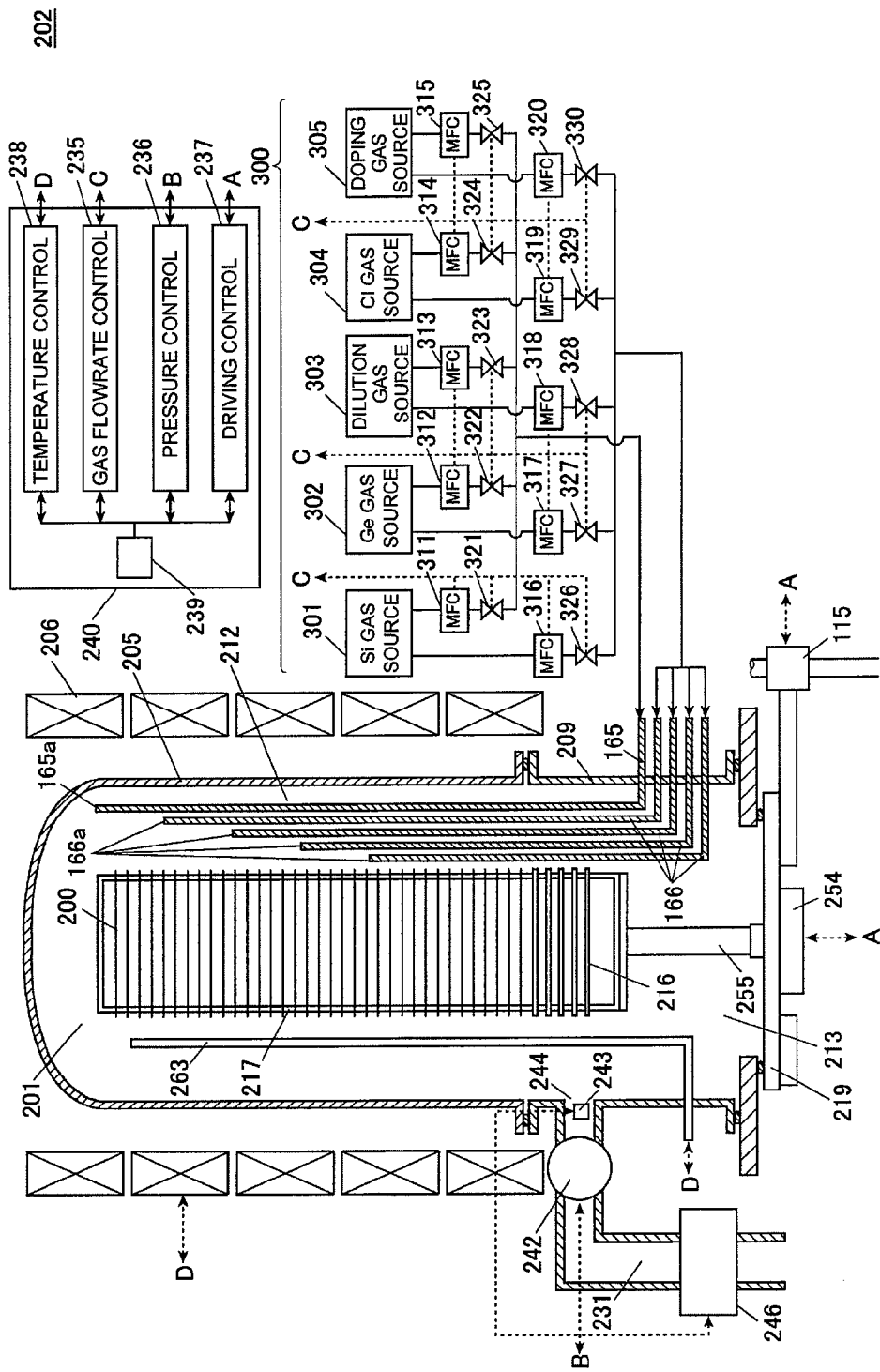
FIG. 2 is a schematic view illustrating a process furnace.

FIG. 2 is a schematic vertical sectional view illustrating the process furnace 202 of the substrate processing apparatus 101. In the state shown in FIG. 2, wafers 200 and the boat 217 are loaded in a process chamber 201. With reference to FIG. 2, the process furnace 202 will now be described.

As shown in FIG. 1, the process furnace 202 includes the heater 206 as a heating unit. The heater 206 has a cylindrical shape and is configured by a heating wire and an insulating material installed around the heating wire. The heater 206 is vertically installed in a state where the heater 206 is supported on a holder (not shown).

At the inside of the heater 206, the reaction tube 205 having a single-pipe shape is installed coaxially with the heater 206. The reaction tube 205 is made of a heat-resistant material such as quartz ($SiO_2$) and silicon carbide (SiC). The reaction tube 205 has a cylindrical shape with a closed top side and an opened bottom side.

At the bottom side of the reaction tube 205, a manifold 209 is installed. The manifold 209 is made of a metal such as stainless steel. The manifold 209 is installed in a cylindrical shape, and the top and bottom sides of the manifold 209 are opened.

The diameter of the manifold 209 is equal to the diameter of the reaction tube 205, and the top side of the manifold 209 is connected to the bottom side of the reaction tube 205, so that the reaction tube 205 can be supported on the manifold 209. Between the manifold 209 and the reaction tube 205, an O-ring is installed as a seal member. The manifold 209 is supported on a holder (not shown) so that the reaction tube 205 can be vertically fixed.

The reaction tube 205 and the manifold 209 constitute a reaction vessel. The process chamber 201 formed in the reaction vessel is divided into a hollow part 212 of the reaction tube 205 and a lower space 213 (hollow part) of the manifold 209.

At the bottom side of the manifold 209, a seal cap 219 is installed as a furnace port cover capable of air-tightly sealing the opened bottom side of the manifold 209. The seal cap 219 is made of a metal such as stainless steel and has a disk shape. On the top surface of the seal cap 219, an O-ring is installed in contact with the bottom side of the manifold 209. At the seal cap 219, a rotary mechanism 254 is installed. A rotation shaft 255 of the rotary mechanism 254 is connected to the boat 217 through the seal cap 219. The rotary mechanism 254 is configured to rotate wafers 200 by rotating the boat 217.

The seal cap 219 can be vertically moved by an elevating motor (not shown) installed at an outer side of the process furnace 202 as an elevating mechanism. Owing to this, the boat 217 can be loaded into and unloaded from the process chamber 201. A driving control unit 237 is electrically connected to the rotary mechanism 254 and a boat elevator 115 so as to control desired operations at desired times.

The boat 217 which is a substrate holder is made of a heat-resistant material such as quartz and silicon carbide. The boat 217 is configured to hold a plurality of wafers 200 (for example, about fifty to one hundred fifty wafers) in a state where the wafers 200 are horizontally positioned and arranged in multiple stages with the centers of the wafers 200 being aligned with each other. At the lower part of the boat 217, a plurality of insulating plates 216 made of a heat-resistant material such as quartz and silicon carbide and having a disk shape are horizontally positioned and arranged in multiple stages as insulating members, so as to make heat transfer from the heater 206 to the manifold 209 difficult.

In addition, inside the reaction tube 205, a temperature sensor 263 is installed.

A temperature control unit 238 is electrically to the heater 206 and the temperature sensor 263, and the temperature control unit 238 is configured to control power to the heater 206 based on temperature information detected by the temperature sensor 263 for obtaining desired temperature distribution at the inside of the process chamber 201 at a desired time.

A gas discharge hole 244 is formed at the manifold 209, and a gas exhaust pipe 231 extends from the gas discharge hole 244 toward an outer area of the manifold 209. The gas exhaust pipe 231 is connected to the vacuum exhaust device 246 such as a vacuum pump through a pressure sensor 243 being a pressure detector and an automatic pressure control (APC) value 242 being a pressure regulator. A pressure control unit 236 is electrically connected to the pressure sensor 243 and the APC value 242, and the pressure control unit 236 is configured to control the opened area of the APC valve 242 based on pressure information detected by the pressure sensor 243 for obtaining a desired pressure level at the inside of the process chamber 201 at a desired time.

A main nozzle (second nozzle) 165 and four sub nozzles 166 are installed at the manifold 209. The nozzles 165 and 166 extend to the inside of the process chamber 201 from the outside of the manifold 209 through the manifold 209. In the process chamber 201, the nozzles 165 and 166 extend from the lower side to the upper side.

Ejection holes 166a are formed at the downstream-side ends (upper ends) of the four sub nozzles 166, respectively, and since the ejection holes 166a are located at the hollow part 212, gas can flow from the upper side to the downside of the process chamber 201. This four ejection holes 166a have different heights. The downstream sides of the sub nozzles 166 are connected to valves 326 to 330. The valve 326 is connected to a silicon (Si)-containing raw material gas supply source 301 through a mass flow controller (MFC) 316. Similarly, the valve 327 is connected to a germanium (Ge)-containing raw material gas supply source 302 through an MFC 317. The valve 328 is connected to a dilution gas supply source 303 through an MFC 318. The valve 329 is connected to a chlorine (Cl)-containing gas supply source 304 through an MFC 319. The valve 330 is connected to a doping raw material gas supply source 305 through an MFC 320. The number of the sub nozzles 166 is not limited to four. For example, the number of the sub nozzles 166 may be two, three, or greater than four. In these cases, it is preferable that the downstream-side ends of the sub nozzles 166 have different heights.

An ejection hole 165a is formed at the downstream-side end (upper end) of the main nozzle 165, and the ejection hole 165a is located at the hollow part 212. The main nozzle 165 is installed in a manner that the distance between the ejection hole 165a of the main nozzle 165 and the gas discharge hole 244 is greater than the distances between the ejection holes 166a of the sub nozzles 166 and the gas discharge hole 244. In the case of forming a boron-doped poly film, an inner tube may be installed inside the reaction tube 205, and the sub nozzles 166 may be longer than the main nozzle 165. Valves 321 to 325 are connected to the upstream side of the main nozzle 165. The valve sensor unit 321 is connected to the Si-containing raw material gas supply source 301 through an MFC 311. Similarly, the valve 322 is connected to the Ge-containing raw material gas supply source 302 through an MFC 312. The valve 323 is connected to the dilution gas supply source 303 through an MFC 313. The valve 324 is connected to the Cl-containing gas supply source 304 through an MFC 314. The valve 325 is connected to the doping raw material gas supply source 305 through an MFC 315.

Silicon-containing gas as a constituent element, such as monosilane ($SiH_4$) gas, $Si_2H_6$ gas, and $SiH_2Cl_2$ gas, is filled in the Si-containing raw material gas supply source 301. Ge-containing gas as a constituent element, such as monogermane ($GeH_4$) gas is filled in the Ge-containing raw material gas supply source 302. Dilution gas such as hydrogen gas and helium gas is filled in the dilution gas supply source 303. Chlorine-containing gas as a constituent element, such as hydrochloric gas and chlorine gas is filled in the Cl-containing gas supply source 304. Boron-containing gas as a constituent element, such as diborane ($B_2H_6$) gas, is filled in the doping raw material gas supply source 305.

The MFCs 311 through 320 are gas flowrate control devices capable of detecting and adjusting the flowrate of gas flowing therethrough.

A gas flowrate control unit 235 is electrically connected to the MFC 311 to 320 and the valve 321 to 330, so as to adjust the flowrate of gas supply to a desired level at a desired time.

A gas supply system that supplies silane gas to the main nozzle 165 is constituted by the Si-containing raw material gas supply source 301, the MFC 311, and the valve 321. A gas supply system that supplies germane gas to the main nozzle 165 is constituted by the Ge-containing raw material gas supply source 302, the MFC 312, and the valve 322; a gas supply system that supplies dilution gas to the main nozzle 165 is constituted by the dilution gas supply source 303, the MFC 313, and the valve 323; a gas supply system that supplies etching gas to the main nozzle 165 is constituted by the Cl-containing gas supply source 304, the MFC 314, and the valve 324; and a gas supply system that supplies a doping raw material gas to the main nozzle 165 is constituted by the doping raw material gas supply source 305, the MFC 315, and the valve 325.

In addition, a gas supply system that supplies silane gas to the sub nozzles 166 is constituted by the Si-containing raw material gas supply source 301, the MFC 316, and the valve 326. A gas supply system that supplies germane gas to the sub nozzles 166 is constituted by the Ge-containing raw material gas supply source 302, the MFC 317, and the valve 327; a gas supply system that supplies dilution gas to the sub nozzles 166 is constituted by the dilution gas supply source 303, the MFC 318, and the valve 328; a gas supply system that supplies etching gas to the sub nozzles 166 is constituted by the Cl-containing gas supply source 304, the MFC 319, and the valve 329; and a gas supply system that supplies a doping raw material gas to the sub nozzles 166 is constituted by the doping raw material gas supply source 305, the MFC 320, and the valve 330.

The gas flowrate control unit 235, the pressure control unit 236, the driving control unit 237, and the temperature control unit 238 constitute a manipulation unit and an input/output unit and are electrically connected to a main control unit 239 which controls the overall operation of the substrate processing apparatus 101. The gas flowrate control unit 235, the pressure control unit 236, the driving control unit 237, the temperature control unit 238, and the main control unit 239 are configured as a controller 240.

Next, together with a main operation of the above-described substrate processing apparatus 101, a method of manufacturing a semiconductor device will be described. In the following description, for example, silane ($SiH_4$) gas is filled in the Si-containing raw material gas supply source 301; germane ($GeH_4$) gas is filled in the Ge-containing raw material gas supply source 302; hydrogen ($H_2$) gas is filled in the dilution gas supply source 303; hydrochloric (HCl) gas is filled in the Cl-containing gas supply source 304; and diborane ($B_2H_6$) gas is filled in the doping raw material gas supply source 305.

A substrate processing operation will now be described.

When a plurality of cassettes 110 are carried into the substrate processing apparatus 101 by an in-plant carrying device (not shown), the transfer machine 106 charges wafers 200 from the cassettes 110 to the boat 217 (wafer charging). After the transfer machine 106 charges wafers 200 to the boat 217, the transfer machine 106 returns to the cassettes 110 for charging the next wafers 200 to the boat 217.

If a predetermined number of wafers 200 are charged into the boat 217 (wafer charging), the controller 240 controls the driving control unit 237 for an elevating operation of the boat elevator 115. Then, the boat 217 in which a group of wafers 200 is held is loaded into the process furnace 202 by the elevating operation of the boat elevator 115 (boat loading), and the opened bottom side of the manifold 209 is closed by the seal cap 219.

Next, when the controller 240 controls the pressure control unit 236 to operate the vacuum exhaust device 246, the inside of the process chamber 201 is evacuated to a desired pressure (vacuum degree) by the vacuum exhaust device 246. At this time, the inside pressure of the process chamber 201 is measured by the pressure sensor 243, and based on the measured pressure, the APC value 242 is feedback-controlled by the pressure control unit 236 of the controller 240.

In addition, when the controller 240 controls the temperature control unit 238 to operate the heater 206, the inside of the process chamber 201 is heated to a desired temperature by the heater 206. At this time, a temperature detected by the temperature sensor 263 is fed back to the controller 240 that controls power to the heater 206. Through this feedback control, the inside temperature of the process chamber 201 is kept in the range from 350° C. to 650° C. The inside temperature of the process chamber 201 is kept at a predetermined temperature until Boron-doped silicon films are completely grown. At this time, the inside temperature of the process chamber 201 is kept almost constant at a predetermined temperature in the region higher than the insulating plates 216; however, the inside temperature of the process chamber 201 is extremely decreased as it goes to the region lower than the insulating plates 216.

Next, the controller 240 controls the driving control unit 237 to operate the rotary mechanism 254. Then, the boat 217 is rotated by the rotary mechanism 254, and thus the wafers 200 are also rotated.

After the controller 240 determines set flowrates of the MFCs 313, 314, 318, and 319 by using the gas flowrate control unit 235, the controller 240 opens the valves 323, 324, 328, and 329. Then, $H_2$ gas and HCl gas are introduced into the process chamber 201 through the main nozzle 165 (for example, one) and the sub nozzles 166 (for example, four). The introduced $H_2$ gas and the HCl gas flow down through the hollow part 212 of the reaction tube 205 and are exhausted through the gas exhaust pipe 231. Alternatively, $H_2$ gas may not be introduced but only HCl gas may be introduced. In this case, the controller 240 does not open the valves 323 and 328.

After a predetermined time, in a state where the valves 323 and 324 are opened, the controller 240 determines set flowrates of the MFCs 311, 313, and 314 and opens the valve 321. Furthermore, in a state where the valves 328 and 329 are opened, the controller 240 determines set flowrates of the MFCs 318, 319, and 320 and opens the valve 330. Then, silane gas, $H_2$ gas, and HCl gas are introduced into the process chamber 201 through the main nozzle 165. In addition, $H_2$ gas, HCl gas, and $B_2H_6$ gas are introduced into the process chamber 201 through the four sub nozzles 166. That is, $H_2$ gas is supplied through any nozzle.

At this time, through the main nozzle 165, silane gas is supplied at a flowrate of 0.01 slm to 2 slm, $H_2$ gas is supplied at a flowrate of 0.1 slm to 20 slm, 10-% germane gas is supplied at a flowrate of 0.001 slm to 1 slm, and HCl gas is supplied at a flowrate of 0.01 slm to 2 slm.

Through the sub nozzles 166, $H_2$ gas is supplied at a flowrate of 0.1 slm to 20 slm, HCl gas is supplied at a flowrate of 0.01 slm to 2 slm, and 0.1-% $B_2H_6$ gas diluted with $H_2$ is supplied at a flowrate of 0.001 slm to 1 slm. The mixing ratio of HCl and $B_2H_6$ is determined based on a desired boron concentration of a B-doped film and the selectivity of HCl.

The flowrates of the gases are adjusted such that the concentration (volume concentration) of HCl gas is greater than the concentration of $B_2H_6$ gas in the main nozzle 165 or the sub nozzles 166. More preferably, the flowrates of gases are set such that the concentration of HCl can be at least six times higher than that of $B_2H_6$. As long as this requirement is satisfied, the flowrates of various gases are not limited to the above-mentioned ranges.

While gases are supplied, the feedback control of the heater 206 is continued so as to keep the inside of the process chamber 201 at a desired temperature.

At the same time with the supply of $B_2H_6$ gas to the sub nozzles 166, $B_2H_6$ gas may also be supplied to the main nozzle 165. In this case, the controller 240 determines the set flowrate of the MFC 315 and then opens the valve 325.

In addition, at the same time with the supply of silane gas to the main nozzle 165, silane gas may also be supplied to the sub nozzles 166. In this case, the controller 240 determines the set flowrate of the MFC 316 and then opens the valve 326.

In the substrate processing apparatus 101, $B_2H_6$ and HCl react with each other at a temperature equal to or higher than 300° C., producing $BCl_3$. Therefore, in a region of the sub nozzles 166 heated to a temperature equal to or higher than 300° C., $B_2H_6$ reacts with HCl more rapidly than it decomposes thermally, thereby producing $BCl_3$. Moreover, due to activated chlorine (Cl) generated by thermal decomposition of $BCl_3$, deposition of a boron-compound is suppressed in the sub nozzles 166. Thus, although an inner region of the sub nozzles 166 is heated to 300° C. or higher, a B-compound film is not formed in the region, and thus the wafers 200 can be properly doped with boron. In addition, in a region of the sub nozzles 166 kept lower than 300° C., $B_2H_6$ is difficult to react with HCl and decompose thermally, and thus a B-compound film is not formed in the region.

When process gas introduced through the main nozzle 165 and the sub nozzles 166 flows through the inside of the process chamber 201, the process gas makes contact with the wafers 200 so that Boron-doped silicon films can be selectively grown on the surfaces of the wafers 200.

After a predetermined time from the introduction of the process gas, the controller 240 controls the heater 206 not to heat the reaction tube 205 and closes the valves 321 to 330, and then inert gas is introduced into the process chamber 201 through the main nozzle 165 and the sub nozzles 166. As a result, the inside atmosphere of the process chamber 201 is replaced with inert gas, and the pressure of the process chamber 201 returns to normal pressure. Thereafter, the operation of the vacuum exhaust device 246 is stopped.

Next, the controller 240 controls the driving control unit 237 to stop the rotary mechanism 254, and together with this, the controller 240 controls the boat elevator 115 for a lowering operation. Then, the seal cap 219 and the boat 217 are moved downward by the lowering operation of the boat elevator 115, and as the bottom side of the manifold 209 is opened, the boat 217 in which the wafers 200 are held is unloaded from the process chamber 201 (boat unloading). Then, the transfer machine 106 transfers the processed wafers 200 from the boat 217 to the cassettes 110. The cassettes 110 in which the processed wafers 200 are placed is taken out of the substrate processing apparatus 101 by the in-plant carrying device (not shown).

In the current embodiment, an explanation is given on a method of growing a Boron-doped silicon film on the surface of a wafer 200. However, alternatively, a Boron-doped silicon germanium film can be grown. In this case, at the time of supplying silane gas, germane gas may be supplied together with the silane gas. germane gas supplied from the Ge-containing raw material gas supply source 302 is introduced into the process chamber 201 as the controller 240 adjusts the set flowrates of the MFC 312 and 317 by controlling the gas flowrate control unit 235 and controls the opening/closing operations of the valves 322 and 327.

According to the above-described embodiments of the present invention, since $B_2H_6$ gas and HCl gas are supplied together, in a region of the sub nozzles 166 heated to 300° C. or higher, the $B_2H_6$ gas and the HCl gas react with each other to produce $BCl_3$. Furthermore, the $BCl_3$ decomposes into activated chlorine (Cl) that reacts with boron, so that boron can be supplied to the inside of the process chamber 201 through the sub nozzles 166 instead of the boron being deposited to form a B-compound film on the insides of the sub nozzles 166. Therefore, wafers 200 can be uniformly doped with boron. In addition, since HCl gas is previously supplied to the inside of the process chamber 201 before $B_2H_6$ gas is supplied, activation of chlorine (Cl) can be enhanced, and thus deposition of a B-compound film can be suppressed more surely.

In addition, since gases are supplied in a manner that the concentration of chlorine (Cl) in a gas supply nozzle is higher than the concentration of boron in the gas supply nozzle, the possibility that boron collides with chlorine (Cl) increases, and thus attachment of boron to the inner wall of the gas supply nozzle can be prevented.

Furthermore, HCl and $B_2H_6$ can be supplied in a manner that the amount of HCl is at least six times higher than that of $B_2H_6$, so as to cause all the decomposed boron to react with $BCl_3$, and thus to prevent deposition of boron on the inner wall of a gas supply nozzle.

By previously supplying chlorine-containing gas as a constituent element to a gas supply nozzle, a layer of gas can be formed on the inner wall of the gas supply nozzle which is made of quartz, and thus attachment of boron to the inner wall of the gas supply nozzle can be prevented.

Temperature is maintained between 350° C. and 650° C. to facilitate the decomposition of boron so that reaction between boron and chlorine (Cl) can be facilitated to prevent attachment of boron to the inner wall of a gas supply nozzle.

Therefore, consumption of $B_2H_6$ by the inside of a nozzle can be reduced, and thus the concentration of boron doped in a wafer 200 can be easily controlled. In addition, since B-compound films are not formed on the inner walls of the sub nozzles 166, it can be prevented that particles are generated from stripped B-compound films.

As described above, according to the present invention, since gases are supplied to the gas supply nozzle in a manner that the concentration of chlorine (Cl) is higher than that of boron, in almost all the region of the gas supply nozzle, boron-containing gas as a constituent element can react with chlorine-containing gas as a constituent element, and thus attachment of a B-compound to the inner wall of the gas supply nozzle can be prevented. Therefore, the present invention can be suitably applied to formation of a Boron-doped silicon epitaxial film.

(Supplementary Note)

While preferred aspects and embodiments of the present invention have been described, the present invention also includes the following embodiments.

(Supplementary Note 1)

According to a preferred embodiment of the present invention, there is provided a method of manufacturing a semiconductor device, the method comprising: loading a plurality of substrate into a process chamber in a state where the substrates are stacked and held at predetermined intervals; forming boron-doped silicon films on the substrates by simultaneously supplying at least a boron-containing gas as a constituent element and a chlorine-containing gas as a constituent element to a gas supply nozzle installed in the process chamber in a manner that concentration of chlorine (Cl) is higher than concentration of boron in the gas supply nozzle; and unloading the substrates from the process chamber.

(Supplementary Note 2)

In the method of Supplementary Note 1, it is preferable that the boron-containing gas as a constituent element be $B_2H_6$, the chlorine-containing gas as a constituent element be HCl, and in the gas supply nozzle, concentration of HCl be at least six times higher than concentration of $B_2H_6$.

(Supplementary Note 3)

In the method of Supplementary Note 1, it is preferable that the chlorine-containing gas as a constituent element be supplied prior to the forming of the Boron-doped silicon films.

(Supplementary Note 4)

In the method of Supplementary Note 1, it is preferable that the forming of the Boron-doped silicon films be performed in a temperature range from 350° C. to 650° C.

(Supplementary Note 5)

In the method of Supplementary Note 1, it is preferable that a main gas supply nozzle and a mid-flow gas supply nozzle be installed in the process chamber, a silicon-containing gas as a constituent element and a chlorine-containing gas as a constituent element be supplied to the main gas supply nozzle, and a boron-containing gas as a constituent element and a chlorine-containing gas as a constituent element be supplied to the mid-flow gas supply nozzle.

(Supplementary Note 6)

In the method of Supplementary Note 1, it is preferable that a main gas supply nozzle and a mid-flow gas supply nozzle be installed in the process chamber, and at least a silicon-containing gas as a constituent element, a boron-containing gas as a constituent element, and a chlorine-containing gas as a constituent element be supplied to any of the gas supply nozzles.

(Supplementary Note 7)

According to another preferred embodiment of the present invention, there is provided a substrate processing apparatus comprising: a process chamber configured to accommodate substrates; a heater configured to heat a substrates; a gas supply unit comprising a gas supply nozzle configured to supply at least a silicon-containing gas as a constituent element, a boron-containing gas as a constituent element, and a chlorine-containing gas as a constituent element to an inside of the process chamber; and a control unit configured to control the process chamber, the heater, and the gas supply unit, wherein the control unit is configured to control: loading a plurality of substrate into the process chamber in a state where the substrates are stacked and held at predetermined intervals; forming boron-doped silicon films on the substrates by simultaneously supplying at least a boron-containing gas as a constituent element and a chlorine-containing gas as a constituent element to the gas supply nozzle installed in the process chamber in a manner that concentration of chlorine (Cl) is higher than concentration of boron in the gas supply nozzle; and unloading the substrates from the process chamber.

(Supplementary Note 8)

In the substrate processing apparatus of Supplementary Note 7, it is preferable that the boron-containing gas as a constituent element be $B_2H_6$, the chlorine-containing gas as a constituent element be HCl, and in the gas supply nozzle, concentration of HCl be at least six times higher than concentration of $B_2H_6$.

(Supplementary Note 9)

In the substrate processing apparatus of Supplementary Note 7, it is preferable that the chlorine-containing gas as a constituent element be supplied prior to the forming of the Boron-doped silicon films.

(Supplementary Note 10)

In the substrate processing apparatus of Supplementary Note 7, it is preferable that the forming of the Boron-doped silicon films be performed in a temperature range from 350° C. to 650° C.

What is claimed is:

1. A method of manufacturing a semiconductor device, the method comprising:
    loading a plurality of substrates into a process chamber,
        wherein the plurality of substrates are stacked and held at a predetermined interval;
    simultaneously supplying at least a boron-containing gas as a constituent element and a chlorine-containing gas as a constituent element to a gas supply nozzle installed in the process chamber,
        wherein as a result of supplying the boron-containing gas and the chlorine-containing gas, a concentration of chlorine in the gas supply nozzle is higher than a concentration of boron in the gas supply nozzle, thereby generating a compound containing the boron and the chlorine in the gas supply nozzle;

forming boron-doped silicon films on the plurality of substrates by doping each of the plurality of substrates with the boron contained in the compound; and unloading the plurality of substrates from the process chamber.

2. The method of claim 1, wherein the chlorine-containing gas is supplied prior to forming the boron-doped silicon films.

3. The method of claim 1, wherein the boron-doped silicon films are formed at a temperature ranging from 350° C. to 650° C.

4. A substrate processing apparatus comprising:

a process chamber configured to accommodate a plurality of substrates;

a heater configured to heat the plurality of substrates;

a gas supply unit comprising a gas supply nozzle configured to supply at least a silicon-containing gas as a constituent element, a boron-containing gas as a constituent element, and a chlorine-containing gas as a constituent element into the process chamber; and a control unit configured to control the process chamber, the heater and the gas supply unit, wherein the control unit controls the gas supply unit to simultaneously supply at least the boron-containing gas and the chlorine-containing gas to the gas supply nozzle installed in the process chamber, wherein as a result of supplying the boron-containing gas and the chlorine-containing gas, a concentration of chlorine in the gas supply nozzle is higher than a concentration of boron in the gas supply nozzle, thereby generating a compound containing the boron and the chlorine in the gas supply nozzle, wherein a boron-doped silicon film is formed on each of the plurality of substrates loaded in the process chamber by doping each of the plurality of substrates with the boron contained in the compound.

5. The method of claim 1, wherein the boron-containing gas comprises $B_2H_6$, and the chlorine-containing gas comprises HCl, and wherein, in the gas supply nozzle, a concentration of the HCl is at least six times higher than a concentration of the $B_2H_6$.

* * * * *